United States Patent
Youssoufian

(10) Patent No.: US 8,041,327 B2
(45) Date of Patent: Oct. 18, 2011

(54) WIDEBAND RESISTIVE INPUT MIXER WITH NOISE-CANCELLED IMPEDANCE

(75) Inventor: Edward Youssoufian, Irvine, CA (US)

(73) Assignee: Newport Media, Inc., Lake Forest, CA (US)

(*) Notice: Subject to any disclaimer, the term of this patent is extended or adjusted under 35 U.S.C. 154(b) by 675 days.

(21) Appl. No.: 12/136,880

(22) Filed: Jun. 11, 2008

(65) Prior Publication Data

US 2008/0242252 A1 Oct. 2, 2008

Related U.S. Application Data

(63) Continuation-in-part of application No. 11/377,721, filed on Mar. 16, 2006, now abandoned.

(51) Int. Cl.
*H04B 1/10* (2006.01)
(52) U.S. Cl. ........ 455/307; 455/323; 455/333; 455/334; 455/338; 327/359; 327/552; 327/355
(58) Field of Classification Search .................. 455/307, 455/323, 333, 334, 338; 327/359, 552, 355
See application file for complete search history.

(56) References Cited

U.S. PATENT DOCUMENTS

| | | | | |
|---|---|---|---|---|
| 6,417,737 B1* | 7/2002 | Moloudi et al. | ............... | 330/301 |
| 7,016,664 B2* | 3/2006 | Souetinov | .................... | 455/323 |
| 7,460,844 B2* | 12/2008 | Molnar et al. | ................ | 455/130 |
| 7,679,431 B2* | 3/2010 | Chang et al. | .................. | 327/552 |
| 7,816,970 B2* | 10/2010 | Kim | ............................... | 327/359 |
| 2007/0230558 A1* | 10/2007 | Sjoland et al. | ................ | 375/235 |
| 2010/0260289 A1* | 10/2010 | Sorrells et al. | ................ | 375/300 |

OTHER PUBLICATIONS

Darabi, H., "A Blocker Filtering Technique for SAW-Less Wireless Receivers," IEEE Journal of Solid-State Circuits, vol. 42, No. 12, Dec. 2007, pp. 2766-2773.
Zhou et al., "A CMOS Passive Mixer With Low Flicker Noise for Low-Power Direct Conversion Receiver," IEEE Journal of Solid-State Circuits, vol. 40, No. 5, May 2005, pp. 1084-1093.

* cited by examiner

*Primary Examiner* — Sanh Phu
(74) *Attorney, Agent, or Firm* — Rahman LLC

(57) ABSTRACT

A radio frequency (RF) mixing circuit including a quadrature mixer that receives non-overlapping in-phase and quadrature local oscillator (LO) signals, and a plurality of low noise amplifiers (LNAs) operatively connected to the quadrature mixer, the plurality of LNAs presenting an input impedance at a baseband. A first voltage at an input node of the quadrature mixer is equal to a second voltage across the impedance up-converted to a frequency of a LO signal received by the quadrature mixer. The second voltage across the LNA input impedance includes a frequency of an input signal of the quadrature mixer down-converted by a frequency of the in-phase and quadrature LO signals and filtered by the impedance. The quadrature mixer down-converts an input signal by a frequency of the in-phase and quadrature LO signals and transfers the noise cancelled impedance to a RF to achieve a noise cancelled match.

18 Claims, 4 Drawing Sheets

WIDEBAND RESISTIVE INPUT MIXER WITH NOISE-CANCELLED IMPEDANCE

CROSS-REFERENCE TO RELATED APPLICATIONS

This application is a continuation-in-part of U.S. application Ser. No. 11/377,721 filed Mar. 16, 2006 and entitled "System and Method for Performing RF Filtering" the complete disclosure of which, in its entirety, is herein incorporated by reference.

BACKGROUND

1. Technical Field

The embodiments herein generally relate to radio frequency (RF) technologies, and, more particularly, to down-converting a wanted RF signal in the presence of undesirable RF signals in a RF network using a wideband resistive input mixer.

2. Description of the Related Art

Orthogonal frequency-division multiplexing (OFDM) technology relates to digital modulation for minimizing interference by multiple-path or fading channels near each other in frequency. For a wireless communication device, a radio frequency (RF) signal is typically received, filtered, and frequency converted. The spectrum input to RF devices typically includes a large number of undesired signals (blockers) in addition to the desired band of interest. Such interferences can be very large, possibly causing intermodulation distortion, desensitization, cross-band modulation, and oscillator pulling, among other undesirable effects.

Most typical RF receivers require a band-limiting filter at their input to eliminate or reduce such interferences. These filters typically require very high selectivity (i.e., a very narrow passband relative to the filter center frequency). In certain wide-band applications, these filters must move to track the desired channel. There are generally two conventional approaches to RF filtering. In applications where tracking is not required, an off-chip resonator such as a surface acoustic wave (SAW) filter is employed.

The benefit of these filters is excellent selectivity and accurate passband location. However, the disadvantages are twofold. First, these filters generally have approximately 2 dB loss in their passband. This translates to an additional 2 dB of noise figure (NF) and thus directly affects the minimum possible sensitivity of the system. Second, these filters invariably add significant cost to the bill of material (BOM) and generally increase the circuit board area.

For tracking applications, a tuning element such as a p-type intrinsic, n-type diode (PIN diode) is used to tune the resonance of a tank or similar resonant circuit. While this approach manages to provide a tunable filtering, it generally suffers from poor stopband attenuation and less passband frequency accuracy than SAW filters. Furthermore, these filters are off-chip, and again impact BOM costs. Finally, such "tracking" filters must be very carefully tuned or they may unintentionally attenuate the desired signal. As a result, factory calibration/tuning is generally required, leading to more cost and complexity of implementation.

Equally important to RF selectivity and filtering is the receiver linearity. Greater linearity offers improved resistance to intermodulation distortion and compression, and allows the demodulation of small signals in the presence of large blockers. Typical designs have widely varying linearity, with cascaded IIP3 ranging from −20 dBm up to +5 dBm. Generally, higher IIP3 designs use more power, which is problematic in portable or battery powered applications. Improving the system linearity will directly improve the ability to receive in the presence of blockers and/or the power consumption of the system.

Finally, in wideband designs achieving a good broadband resistive match typically comes at the expense of noise. Commonly used techniques have >4 dB noise figure, which directly degrades the system sensitivity. As a result providing low-noise or "noise-cancelled" resistive input impedance is of great utility.

SUMMARY

In view of the foregoing, an embodiment herein provides a radio frequency (RF) mixing circuit including a quadrature mixer that receives non-overlapping in-phase and quadrature local oscillator (LO) signals, and a plurality of low noise amplifiers (LNAs) operatively connected to the quadrature mixer, the plurality of LNAs presenting an input impedance at a baseband. A first voltage at an input node of the quadrature mixer is equal to a second voltage across the impedance up-converted to a frequency of a LO signal received by the quadrature mixer.

The second voltage across the LNA input impedance includes a frequency of an input signal of the quadrature mixer down-converted by a frequency of the in-phase and quadrature LO signals and filtered by the impedance. The quadrature mixer down-converts an input signal by a frequency of the in-phase and quadrature LO signals and transfers the noise cancelled impedance to a RF to achieve a noise cancelled match. The noise cancelled match includes a resistive match.

Each LNA input impedance includes at least one of a resistor and a capacitor, and the resistor is connected either in a parallel combination or a series combination with the capacitor. The LNA input impedance includes a first component including a first resistor in parallel with a first capacitor, and a second component including an active impedance, the first component is connected in at least one of a parallel combination and a series combination with the second component. The quadrature mixer includes a plurality of metal oxide semiconductor field effect transistor (MOSFET) switches driven by the in-phase and quadrature LO signals.

The plurality of MOSFET switches are connected in parallel to one another. Each of the MOSFET switch includes a gate, a drain, and a source. The drain of each of the MOSFET switch are operatively coupled to one another to receive a RF signal. The source of each of the MOSFET switch are operatively connected to a respective impedance. The gate of each of the MOSFET switch to receive the LO signals for turning on the MOSFET switch. The input impedance at a baseband includes a noise cancelled impedance.

Another embodiment provides a circuit including a plurality of MOSFET switches connected in parallel to one another and driven by independent non-overlapping in-phase and quadrature LO signals, a drain of each MOSFET switch is operatively coupled to one another to receive a signal, a source of each MOSFET switch is operatively connected to a respective impedance, and a gate of each of the MOSFET switch receives the LO signals for turning on the MOSFET switch.

Another embodiment provides a circuit including a plurality of MOSFET switches connected in parallel to one another and driven by independent non-overlapping in-phase and quadrature LO signals, a drain of each MOSFET switch is operatively coupled to one another to output a signal, a source of each MOSFET switch is operatively connected to a respective signal, and a gate of each of the MOSFET switch receives the LO signals for turning on the MOSFET switch.

Another embodiment provides a method of filtering signals in a wireless network system is provided. The method includes receiving a RF signal, performing a down-conversion of the RF signal to in-phase and quadrature baseband signals, and transferring an impedance to RF to achieve a noise cancelled match. The noise cancelled match is a resistive match.

The RF signal is down-converted by a quadrature mixer. The impedance is transferred based on an up-converted impedance of the quadrature mixer. The impedance is the input impedance of a plurality of LNAs. The quadrature mixer includes a plurality of MOSFET switches driven by the in-phase and quadrature LO signals.

The plurality of MOSFET switches are connected in parallel to one another. Each of the MOSFET switch includes a gate, a drain, and a source. The drain of each of the MOSFET switch are operatively coupled to one another to receive a RF signal. The source of each of the MOSFET switch are operatively connected to a respective impedance. The gate of each of the MOSFET switch to receive the LO signals for turning on the MOSFET switch. The input impedance at a baseband includes a noise cancelled impedance.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
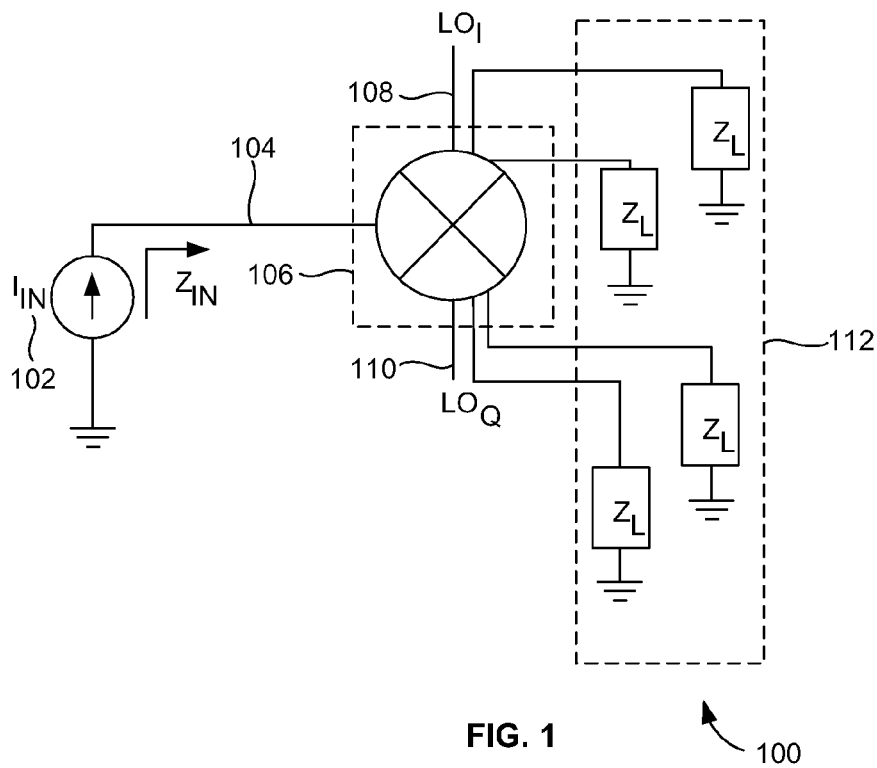
FIG. 1 illustrates a downconversion and RF filtering circuit according to a first embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a RF mixing circuit with a noise-cancelled, upconverted input impedance. Referring now to the drawings, and more particularly to FIGS. 1 through 7, where similar reference characters denote corresponding features consistently throughout the figures, there are shown preferred embodiments.

FIG. 1 illustrates a downconversion and filtering circuit 100 which includes a current source Iin 102, a node 104, a quadrature mixer 106, and a filtering impedance 112. The quadrature mixer 106 is connected in series with the filtering impedance 112. A RF signal from the current source Iin 102 is fed as an input signal to the quadrature mixer 106. The input signal (e.g., the RF signal) is down converted in frequency by the quadrature mixer 106, and simultaneously filtered and converted to voltage by the impedances 112. The resulting voltage is then upconverted to node 104 by the LO in-phase and quadrature signals 108, 110.

This entire sequence of events is equivalent to the input signal being filtered at a RF by the filtering impedance 112 upconverted and centered around the LO frequency. This occurs because the voltage at the node 104 is the voltage across the filtering impedances 112 up-converted to a local oscillator frequency $\omega_{LO}$. In one embodiment, the local oscillator frequency $\omega_{LO}$ may be set equal to the frequency of the channel desired to be received. The voltage across the filtering impedance 112 is the input signal of the current source 102 down-converted by the frequency of in-phase and quadrature LO signals 108 and 110 and filtered by the filtering impedances 112.

Figure 2:
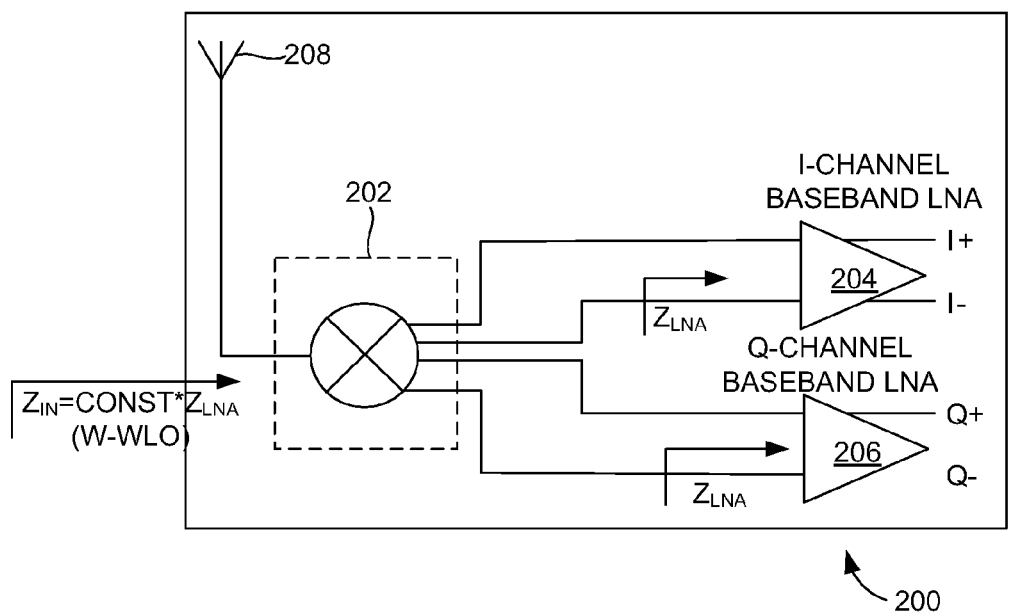
FIG. 2 illustrates an alternative embodiment of a combined filtering/downconversion circuit using an upconverted impedance to provide resistive match in a wireless system according to an embodiment herein.

FIG. 2 illustrates an alternative embodiment of a combined filtering/downconversion circuit 200 using an upconverted impedance to provide resistive match according to an embodiment herein. The combined filtering/downconversion circuit 200 includes a quadrature passive mixer 202, an I-channel Baseband Low Noise Amplifier (LNA) 204, and a Q-channel Baseband LNA 206. The quadrature passive mixer 202 receives and downconverts an RF signal. The quadrature passive mixer 202 outputs are simultaneously converted to voltage and filtered by the input impedance of baseband LNAs 204, 206. The LNA 204 and the LNA 206 output amplified I and Q signals, respectively.

In one preferred embodiment, the baseband LNA input impedance is a noise-cancelled or Miller-multiplied resistance. The voltage at the input node of the quadrature passive mixer 202 is the voltage across the (possibly noise cancelled) LNA input impedance ($Z_{LNA}$) up-converted to the frequency of the in-phase and quadrature LO signal received by the quadrature passive mixer 202. Conversely, the voltage across the baseband LNA input impedance consists of the RF input signal of the quadrature passive mixer 202 down-converted by a frequency of the in-phase and quadrature LO signals and filtered by the noise cancelled impedance. The LNA 204 and the LNA 206 effectively act as low noise amplifiers at baseband instead of RF.

In one embodiment, the LNA 204 and the LNA 206 include a noise cancelled impedance at baseband. Such an LNA also commonly referred to as a transimpedance amplifier. The matching is only performed over a band of interest (e.g., the signals out of the band of interest are not matched but are attenuated).

Figure 3:
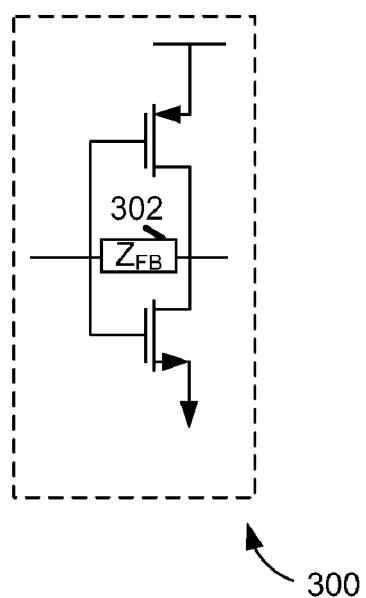
FIG. 3 illustrates a LNA circuit according to an embodiment herein.
Figure 4A:
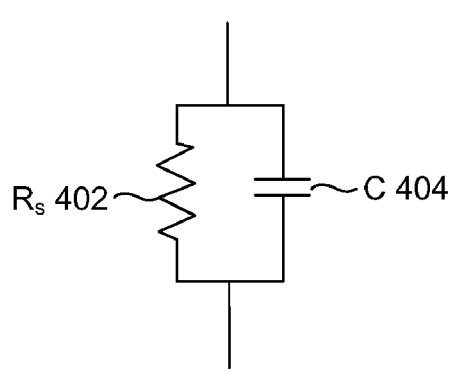
FIGS. 4A and 4B illustrate circuits of the impedance of the LNA circuit of FIG. 3 according to an embodiment herein.
Figure 4B:
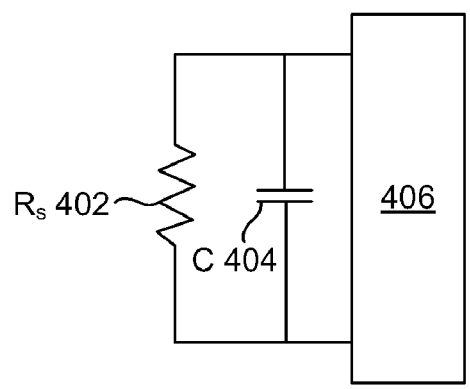

FIG. 3 illustrates a LNA circuit 300 according to an embodiment herein. The LNA circuit 300 includes impedance $Z_{FB}$ 302. The LNA circuit 300 may be the LNA 204, and/or the LNA 206 (of FIG. 2). In this embodiment, the LNA circuit 300 is a shunt feedback amplifier with complimentary gm stage. The impedance $Z_{FB}$ 302 may be a simple resistor with resistance selected such that the input impedance presented by the mixer is some desired value. In one embodiment, the impedance $Z_{FB}$ 302 may include a component as shown in FIGS. 4A and 4B. Also, FIG. 4A, with reference to FIG. 3, illustrates an equivalent circuit of the input impedance of the LNA circuit 300 according to an embodiment herein. The impedance $Z_{FB}$ 302 includes a resistor $R_S$ 402 connected in parallel with a capacitor C 404 according to an embodiment herein. The impedance $Z_{FB}$ 402 may also be a series combination of a resistor Rs 402 and a capacitor C 404.

FIG. 4B, with reference to FIG. 3, illustrates an alternate embodiment of the impedance $Z_{FB}$ 302 of the LNA circuit 300 according to an embodiment herein. For instance, in an embodiment the impedance $Z_{FB}$ 302 includes the resistor $R_S$ 402 and the capacitor C 404 connected in parallel with an active impedance 406.

Figure 5:
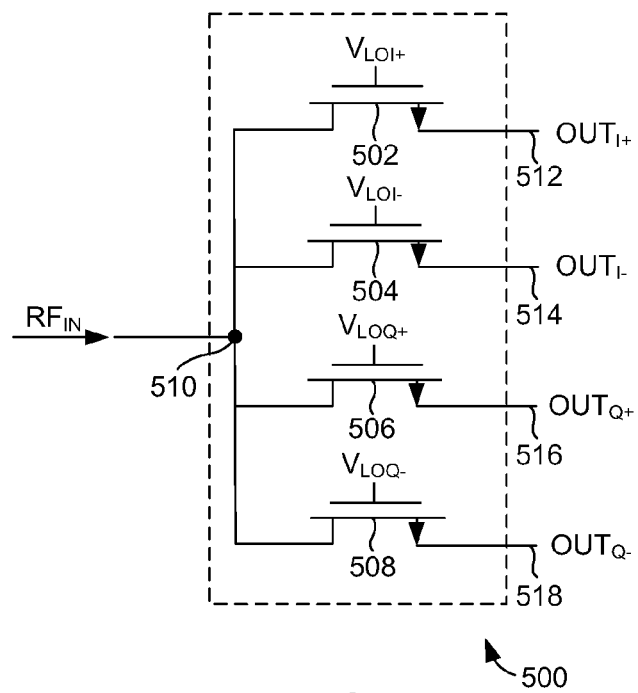
FIG. 5 illustrates a circuit diagram of the quadrature mixer of FIG. 2 according to an embodiment herein.

FIG. 5 illustrates a circuit diagram 500 of a plurality of MOSFET switches 502-508 of the quadrature mixer 202 (of FIG. 2) connected in parallel according to an embodiment herein. The quadrature mixer 202 includes the same MOSFET switches 502-508. Each MOSFET switch of the MOSFET switches 502-508 includes a gate, a drain and a source. The gate of each MOSFET switch of the MOSFET switches 502-508 is driven by four non-overlapping quadrature LO phases. The drains of the respective MOSFET switches 502-508 are connected together to node 510, to receive a RF signal. The respective sources 512-518 of the MOSFET switches 502-508 are taken out to four identical (possibly noise-cancelled) load impedances 112 of FIG. 1. Since the MOSFET source and drain are interchangeable terminals, the drain and source connections can be swapped and identical circuit performance will be achieved.

Figure 6:
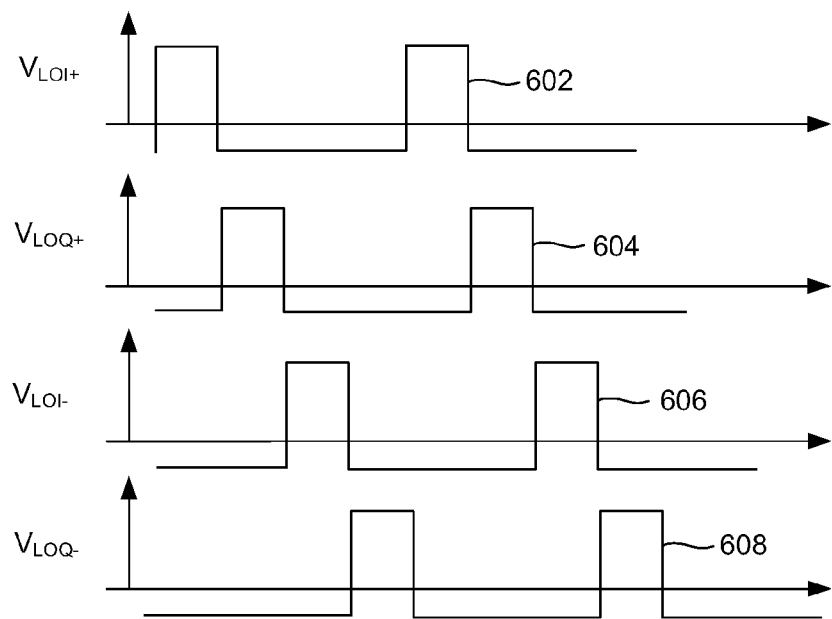
FIG. 6 illustrates a graphical representation of the in-phase and quadrature LO signals waveforms having non-overlapping phases driving the gates of the MOSFET switches of FIG. 5 according to an embodiment herein.

FIG. 6 illustrates a graphical representation 600 of the in-phase and quadrature LO signals waveforms having non-overlapping phases 602-608 driving the gates of the MOSFET switches 502-508 of FIG. 5 according to an embodiment herein. The four non-overlapping phases have the frequency ωLO and an amplitude. The four non-overlapping phases 602-608 turn ON and OFF the MOSFET switches 502-508.

Figure 7:
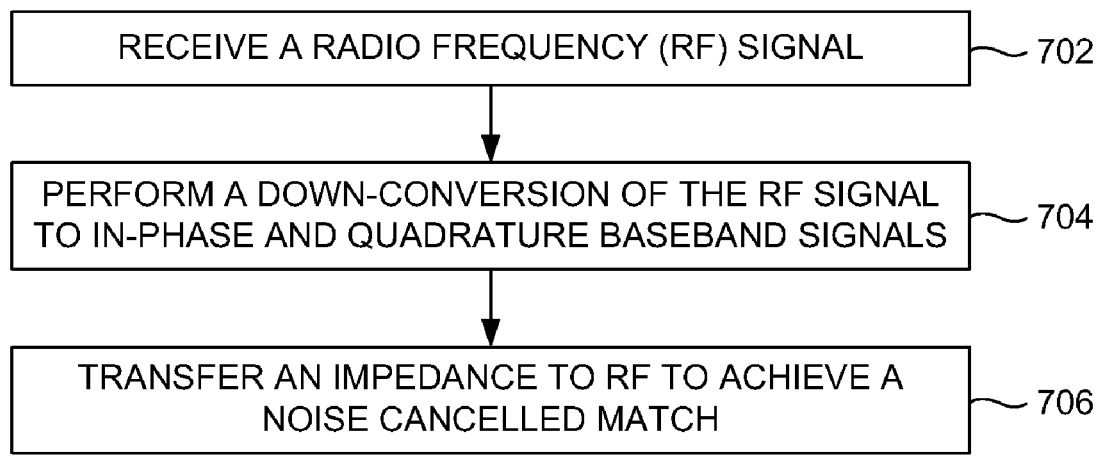
FIG. 7 is a flow diagram illustrating a method of filtering signals in a wireless system according to an embodiment herein.

FIG. 7, with reference to FIGS. 1 through 6, is a flow diagram illustrating a method of filtering signals in a wireless system according to an embodiment herein. In step 702, a RF signal is received. In step 704, a down-conversion of the RF signal to in-phase and quadrature baseband signals is performed. The RF signal is down-converted by the quadrature mixer 202 of FIG. 2. In step 706, an impedance is transferred to RF to achieve a noise cancelled match. The impedance is transferred based on an up-converted impedance of the quadrature mixer 202. The noise cancelled match is a resistive match. The impedance is the input impedance of a plurality of LNAs.

The RF filtering circuit 200 of the wireless network system is highly linear and provides a noise cancelled match. The embodiments herein solve the problem of converting a single-ended RF input into a differential output and allow for cancelling the noise generated at the RF input of the device by the resistive match. The RF filtering/mixing circuit 300 allows for a wideband match with NF~2 dB, linearity in excess of +10 dBm, and filters blockers as they are applied to the BB LNAs 204 and 206. In one embodiment, the match at RF is effectively performed by a noise-cancelled impedance at baseband.

The circuit 200 provided by the embodiments herein allows for the relaxation of the conventional receivers' trade-off between noise and linearity. This trade-off can be found both at the circuit and system level. At the system level, a low cascaded system noise is easier to achieve when the receiver gain is high and high linearity is easier to achieve when the receiver gain is low. At the circuit level, low noise points to very high device gm, and high linearity requires either a low gm or a high current. The embodiments herein mitigate the trade-offs at system level by providing a very high linearity and low noise at the same time. Furthermore, the linearity and noise both improve with decreased switch resistance. Thus larger switches improve both linearity and noise with only a minor power consumption increase.

The circuit 200 also provides for single-ended to differential conversion. Antennas typically provide single ended connectivity, but common circuit design practice is to use differential circuitry as much as possible. The circuit 200 converts the single-ended antenna input into differential outputs. Furthermore, the RF filtering circuit 200 further provides for a low noise match. Typically, the input impedance of the receiver is well defined (often at 50 ohms). To reduce noise, a noise-cancelled impedance (i.e. an impedance which looks like a resistive of 50 ohms but does not generate the noise of the resistive 50 ohms) is used. The circuit 200 does this by upconverting a noise-cancelled impedance at baseband (the input impedance of the BB LNAs 204 and 206) to RF. The RF filtering circuit 200 delivers this high performance in a low-cost complementary metal oxide semiconductor (CMOS) process.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A radio frequency (RF) mixing circuit comprising:
    a quadrature mixer that receives in-phase and quadrature local oscillator (LO) signals, wherein said quadrature mixer comprises a plurality of metal oxide semiconductor field effect transistor (MOSFET) switches driven by said in-phase and quadrature LO signals, and wherein said plurality of MOSFET switches are connected in parallel to one another, each of said MOSFET switch comprises a gate, a drain, and a source, wherein said drain of each of said MOSFET switch are operatively coupled to one another to receive a RF signal, wherein said source of each of said MOSFET switch are operatively connected to a respective impedance, wherein said gate of each of said MOSFET switch to receive said LO signals for turning on said MOSFET switch, and wherein said quadrature mixer down-converts said RF signal; and
    a plurality of low noise amplifiers (LNAs) operatively connected to said quadrature mixer, said plurality of LNAs presenting an input impedance at a baseband, wherein a first voltage at an input node of said quadrature mixer is equal to a second voltage across said impedance up-converted to a frequency of a LO signal received by said quadrature mixer,
    wherein said input impedance at a baseband comprises a noise cancelled impedance.

2. A radio frequency (RF) mixing circuit comprising:
    a quadrature mixer that receives in-phase and quadrature local oscillator (LO) signals, wherein said quadrature mixer comprises a plurality of metal oxide semiconductor field effect transistor (MOSFET) switches driven by said in-phase and quadrature LO signals, and wherein said plurality of MOSFET switches are connected in parallel to one another, each of said MOSFET switch comprises a gate, a drain, and a source, wherein said drain of each of said MOSFET switch are operatively coupled to one another to receive a RF signal, wherein said source of each of said MOSFET switch are operatively connected to a respective impedance, wherein said gate of each of said MOSFET switch to receive said LO signals for turning on said MOSFET switch, and wherein said quadrature mixer down-converts said RF signal; and
    a plurality of low noise amplifiers (LNAs) operatively connected to said quadrature mixer, said plurality of LNAs presenting an input impedance at a baseband, wherein a first voltage at an input node of said quadrature mixer is equal to a second voltage across said impedance up-converted to a frequency of a LO signal received by said quadrature mixer, wherein said second voltage across the LNA input impedance comprises a frequency of an input signal of said quadrature mixer down-converted by a frequency of said in-phase and quadrature LO signals and filtered by said impedance.

3. The RF mixing circuit of claim 1, wherein said quadrature mixer down-converts an input signal by a frequency of said in-phase and quadrature LO signals and transfers said noise cancelled impedance to a RF to achieve a noise cancelled match, wherein said noise cancelled match comprises a resistive match.

4. The RF mixing circuit of claim 1, wherein each LNA input impedance comprises at least one of a resistor and a capacitor, and said resistor is connected either in a parallel combination or a series combination with said capacitor.

5. A radio frequency (RF) mixing circuit comprising:
    a quadrature mixer that receives in-phase and quadrature local oscillator (LO) signals, wherein said quadrature mixer comprises a plurality of metal oxide semiconductor field effect transistor (MOSFET) switches driven by said in-phase and quadrature LO signals, and wherein said plurality of MOSFET switches are connected in parallel to one another, each of said MOSFET switch comprises a gate, a drain, and a source, wherein said drain of each of said MOSFET switch are operatively coupled to one another to receive a RF signal, wherein said source of each of said MOSFET switch are operatively connected to a respective impedance, wherein said gate of each of said MOSFET switch to receive said LO signals for turning on said MOSFET switch, and wherein said quadrature mixer down-converts said RF signal; and
    a plurality of low noise amplifiers (LNAs) operatively connected to said quadrature mixer, said plurality of LNAs presenting an input impedance at a baseband, wherein a first voltage at an input node of said quadrature mixer is equal to a second voltage across said impedance up-converted to a frequency of a LO signal received by said quadrature mixer, wherein each LNA input impedance comprises:
        a first component comprising a first resistor in parallel with a first capacitor; and
        a second component comprising an active impedance, wherein said first component is connected in at least one of a parallel combination and a series combination with said second component.

6. The RF mixing circuit of claim 1, wherein said in-phase and quadrature LO signals comprises four independent non-overlapping in-phase and quadrature LO signals.

7. The RF mixing circuit of claim 6, wherein said LO signals turn off said MOSFET switch.

8. The RF mixing circuit of claim 5, wherein said input impedance at a baseband comprises a noise cancelled impedance.

9. A circuit comprising a plurality of metal oxide semiconductor field effect transistor (MOSFET) switches connected in parallel to one another and driven by independent in-phase and quadrature local oscillator (LO) signals, wherein a drain of each MOSFET switch is operatively coupled to one another to receive a signal, wherein a source of each of said MOSFET switch is operatively connected to a respective impedance, wherein a gate of each of said MOSFET switch receives said LO signals for turning on said MOSFET switch, and wherein said impedance comprises a noise cancelled impedance.

10. A method of filtering signals in a wireless network system, said method comprising:
    receiving a radio frequency (RF) signal;

performing a down-conversion of said RF signal to in-phase and quadrature baseband signals, wherein said RF signal is down-converted by a quadrature mixer; and transferring an impedance to RF to achieve a noise cancelled match, wherein said noise cancelled match is a resistive match, wherein said quadrature mixer comprises a plurality of metal oxide semiconductor field effect transistor (MOSFET) switches driven by in-phase and quadrature local oscillator (LO) baseband signals, wherein said plurality of MOSFET switches are connected in parallel to one another, each of said MOSFET switch comprises a gate, a drain, and a source, wherein said drain of each of said MOSFET switch are operatively coupled to one another to receive said RF signal, wherein said source of each of said MOSFET switch are operatively connected to a respective impedance, and wherein said gate of each of said MOSFET switch to receive a LO signal for turning on said MOSFET switch, and wherein said impedance is transferred based on an up-converted impedance of said quadrature mixer.

11. The method of claim 10, wherein said impedance comprises a Miller-multiplied resistance.

12. The method of claim 10, wherein said impedance is the input impedance of a plurality of low noise amplifiers (LNAs).

13. The method of claim 10, wherein said in-phase and quadrature LO signals comprises four independent non-overlapping in-phase and quadrature LO signals.

14. The method of claim 13, wherein said LO signals turn off said MOSFET switch.

15. The method of claim 10, wherein said impedance comprises a noise cancelled impedance.

16. The circuit of claim 9, wherein said independent in-phase and quadrature local oscillator (LO) signals comprises four independent non-overlapping in-phase and quadrature LO signals, and wherein said LO signals turn off said MOSFET switch.

17. The method of claim 14, wherein said in-phase and quadrature LO signals comprises four independent non-overlapping in-phase and quadrature LO signals, and wherein said LO signal turns off said MOSFET switch.

18. The RF mixing circuit of claim 2, wherein said input impedance comprises a noise cancelled impedance.

* * * * *